US00RE46599E

(19) United States
(12) Reissued Patent
Crowley et al.

(10) Patent Number: US RE46,599 E
(45) Date of Reissued Patent: Nov. 7, 2017

(54) SPUTTERING APPARATUS

(71) Applicant: SPUTTERING COMPONENTS, INC., Owatonna, MN (US)

(72) Inventors: Daniel Theodore Crowley, Owatonna, MN (US); William A. Meredith, Jr., Faribault, MN (US)

(73) Assignee: SPUTTERING COMPONENTS INC., Owatonna, MN (US)

(21) Appl. No.: 15/365,512

(22) Filed: Nov. 30, 2016

Related U.S. Patent Documents

Reissue of:
(64) Patent No.: 8,900,428
Issued: Dec. 2, 2014
Appl. No.: 13/344,871
Filed: Jan. 6, 2012

U.S. Applications:
(60) Provisional application No. 61/430,361, filed on Jan. 6, 2011.

(51) Int. Cl.
*C23C 14/35* (2006.01)
*H01J 37/34* (2006.01)

(52) U.S. Cl.
CPC ..... *C23C 14/35* (2013.01); *C23C 14/354* (2013.01); *H01J 37/342* (2013.01); (Continued)

(58) Field of Classification Search
CPC .... C23C 14/35; C23C 14/354; H01J 37/3452; H01J 37/3405; H01J 37/345
See application file for complete search history.

(56) References Cited

U.S. PATENT DOCUMENTS 5,047,131 A 9/1991 Wolfe
5,096,562 A 3/1992 Boozenny
(Continued)

FOREIGN PATENT DOCUMENTS

CN 1297575 5/2001
CN 101545094 9/2009
(Continued)

OTHER PUBLICATIONS

State Intellectual Property Office of the People's Republic of China, "Notification to Grant Patent Right for Invention for CN Application No. 201280004692.6 mailed Sep. 29, 2015", from Foreign Counterpart of U.S. Appl. No. 13/344,871, Sep. 29, 2015, pp. 1-5, Published in: CN.

(Continued)

*Primary Examiner* — Terrence Till
(74) *Attorney, Agent, or Firm* — Fogg & Powers LLC

(57) ABSTRACT

In one embodiment, a magnetron assembly comprises a plurality of magnets and a yoke configured to hold the plurality of magnets in at least four independent linear arrays. The plurality of magnets is arranged in the yoke so as to form a pattern comprising an outer portion and an inner portion. The outer portion substantially surrounds the perimeter of the inner portion. The magnets used to form the outer portion have a first polarity and the magnets used to form the inner portion having a second polarity. The outer portion of the pattern comprises a pair of elongated sections that are substantially parallel to one another. The outer portion of the pattern comprises a pair of turnaround sections, wherein each turnaround section substantially spans respective ends of the pair of elongated sections and wherein each turnaround section comprises a plurality of magnets having the first polarity. Other embodiments are described.

45 Claims, 7 Drawing Sheets

(52) U.S. Cl.
CPC ..... *H01J 37/3405* (2013.01); *H01J 37/345* (2013.01); *H01J 37/347* (2013.01); *H01J 37/3452* (2013.01); *H01J 37/3482* (2013.01)

(56) References Cited

U.S. PATENT DOCUMENTS

| | | | | |
|---|---|---|---|---|
| 5,364,518 | A * | 11/1994 | Hartig et al. | 204/298.22 |
| 5,427,665 | A | 6/1995 | Hartig et al. | |
| 5,814,195 | A | 9/1998 | Lehan et al. | |
| 6,264,803 | B1 | 7/2001 | Morgan et al. | |
| 6,375,814 | B1 * | 4/2002 | De Bosscher et al. | 204/298.21 |
| 2004/0178056 | A1 * | 9/2004 | De Bosscher et al. | 204/192.12 |
| 2008/0047831 | A1 | 2/2008 | Richert et al. | |
| 2009/0139853 | A1 | 6/2009 | Yamamoto et al. | |
| 2010/0044222 | A1 | 2/2010 | Miller et al. | |
| 2010/0193354 | A1 | 8/2010 | Chu | |
| 2010/0200395 | A1 | 8/2010 | Dietrich et al. | |
| 2010/0300877 | A1 | 12/2010 | Nadel et al. | |
| 2012/0175251 | A1 | 7/2012 | Crowley et al. | |
| 2012/0261253 | A1 | 10/2012 | Madocks et al. | |
| 2014/0061029 | A1 | 3/2014 | Morse | |

FOREIGN PATENT DOCUMENTS

| | | |
|---|---|---|
| JP | 62023979 | 1/1987 |
| JP | H10121236 | 5/1998 |
| JP | H11500490 | 1/1999 |
| JP | 2001164362 | 6/2001 |
| JP | 2006016634 | 1/2006 |
| KR | 1019927002436 | 9/1992 |
| KR | 1020080085893 | 9/2008 |
| WO | 9107521 | 5/1991 |
| WO | 9621750 | 7/1996 |
| WO | 2011056581 | 5/2011 |

OTHER PUBLICATIONS

State Intellectual Property Office, P.R. China, "First Office Action from CN Application No 201280004692.6 mailed Jan. 21, 2015", from Foreign Counterpart of U.S. Appl. No. 13/344,871, Jan. 21, 2015, pp. 1-10, Published in: CN.

Japanese Patent Office, "Office Action from JP Application No. 2013-548564 mailed Aug. 27, 2015", from Foreign counterpart of U.S. Appl. No. 13/344,871, Aug. 27, 2015, pp. 1-6, Published in: JP.

Japanese Patent Office, "Pre-Final Office Action from JP Application No. 2013-548564 mailed Jul. 27, 2016", from Foreign Counterpart of U.S. Appl. No. 13/344,871, Jul. 27, 2016, pp. 1-6, Published in: JP.

U.S. Patent and Trademark Office, "Advisory Action", from U.S. Appl. No. 13/344,871, Apr. 10, 2014, pp. 1-2, Published in: US.

U.S. Patent and Trademark Office, "Notice of Allowance", from U.S. Appl. No. 13/344,871, Jun. 24, 2014, pp. 1-12, Published in: US.

International Preliminary Examining Authority, "International Preliminary Report on Patentability", from Foreign Counterpart of U.S. Appl. No. 13/344,871, Jul. 18, 2013, pp. 1-5, Published in: WO.

State Intellectual Property Office, P.R. China, "First Office Action from CN Application No. 201380046219.9 mailed Jun. 13, 2016", from Foreign Counterpart of U.S. Appl. No. 14/016,693, Jun. 13, 2016, pp. 1-19, Published in: CN.

European Patent Office, "European Extended Search Report from EP Application No. 13834622.6", from Foreign Counterpart of U.S. Appl. No. 14/016,693, Mar. 2, 2016, pp. 1-9, Published in: EP.

European Patent Office, "Extended European Search Report from EP Application No. 12732335.0 mailed Dec. 1, 2015", from Foreign Counterpart of U.S. Appl. No. 13/344,871, Dec. 1, 2015, pp. 1-12, Published in: EP.

Korean Intellectual Property Office, "International Search Report and Written Opinion", from PCT counterpart of U.S. Appl. No. 14/016,693, Dec. 4, 2013, pp. 1-14, Published in: KR.

U.S Patent Office, "Final Office Action", from U.S. Appl. No. 13/344,871, Jan. 29, 2014, pp. 1-20, Published in: US.

U.S. Patent Office, "Office Action", from U.S. Appl. No. 13/344,871, Jun. 27, 2013, pp. 1-16, Published in: US.

European Patent Office, "Article 94(3) EPC", Foreign Counterpart to U.S. Appl. No. 14/016,693, Jan. 3, 2017, pp. 1-7, Published in: EP.

Japan Patent Office, "Notice of Allowance for JP Application No. 2013-548564 mailed Feb. 24, 2017", Foreign counterpart to U.S. Appl. No. 14/016,693, Feb. 24, 2017, pp. 1-4, Published in: JP.

State Intellectual Property Office of the People's Republic of China, "Notification to Grant Patent Right for Invention", Foreign Counterpart to U.S. Appl. No. 14/016,693, Feb. 6, 2017, pp. 1-7, Published in: CN.

Taiwan Intellectual Property Office, "Search Report of Patent Application No. 102131641", Foreign aounterpart to U.S. Appl. No. 14/016,693, Feb. 15, 2017, pp. 1-12, Published in: TW.

Chinese Patent Office, First Office Action from CN Application No. 201510922598.4 dated Jun. 26, 2017, Foreign Counterpart to U.S. Appl. No. 13/344,871, pp. 1-9, Published in: CN.

International Searching Authority, "International Search Report and Written Opinion", Mailed Aug. 22, 2012, pp. 1-8, Published in: WO.

* cited by examiner

DIFFERENT GEOMETRY MAGNETS
DIFFERENT SIZED MAGNETS
DIFFERENT STRENGTH MAGNETS

SPUTTERING APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This *Reissue* application *is a reissue of application Ser. No. 13/344,871, filed Jan. 6, 2012, which* claims the benefit of U.S. Provisional Patent Application Ser. No. 61/430,361, filed Jan. 6, 2011, *both of* which [is] *are* hereby incorporated herein by reference.

TECHNICAL FIELD

This description generally relates to rotating-cathode magnetron sputtering. In particular, it deals with certain problems encountered when the target material is increased beyond the point where standard magnetron assemblies can supply adequate magnetic flux suitable for magnetron sputtering. Additionally, some embodiments of the present invention improve process conditions for the deposition of such materials as transparent conductive oxides (TCO).

BACKGROUND

Magnetron sputtering of rotating targets is well known in the art and is used extensively for producing a wide variety of thin films on a wide variety of substrates. A reasonable over-view of sputtering with rotating cathodes can be found in U.S. Pat. No. 5,096,562 (which is hereby incorporated by reference herein), as one example.

In the most basic form of rotating-target magnetron sputtering, the material to be sputtered is either formed in the shape of a tube or is adhered to the outer surface of a support tube made of rigid material. A magnetron assembly is disposed within the tube and supplies magnetic flux which permeates the target such that there is adequate magnetic flux at the outer surface of the target. The magnetic field is designed in a way such that it retains electrons emitted from the target so as to increase the probability that they will have ionizing collisions with the working gas, hence enhancing the efficiency of the sputtering process.

Fabrication cost for targets of some materials, in particular ceramic TCO materials, are relatively high in comparison to the cost of the raw materials. To improve the economy of these targets, it is desirable to increase the thickness of the target material. In this way, the target will have significantly more usable material while adding only minimally to the overall cost of the target. This is because the fabrication cost does not change significantly. The only significant increase is due to the additional raw material used. Thicker targets should have the added benefit of allowing longer production campaigns between target changes.

As mentioned, increasing the target thickness too much can result in inadequate magnetic flux at the target surface when using standard magnetron assemblies. The need for a magnetron design with higher magnetic flux is clear.

However, the effort to increase magnetic flux will usually create a new problem wherein the width of the turn-around is broadened. This, in turn, results in an increased relative erosion rate at the target ends and, therefore, a shortened target life due to target "burn-through". This is contrary to the purpose of increasing the target thickness.

SUMMARY

The typical magnetron assembly 100 (shown in FIG. 1A0 for rotating cathodes comprises three substantially parallel rows 102 of magnets attached to a yoke 104 of magnetically conductive material, such as steel, that helps complete the magnetic circuit. The direction of magnetization of the magnets will be radial with respect to the major axis of the sputtering target. The center row 106 will have the opposite polarity of the two outer rows 108. (see FIG. 1B) Additional description of this type of magnetron can be found in U.S. Pat. No. 5,047,131 (which is hereby incorporated by reference herein). Magnetic flux of the inner and outer rows 106 and 108 of magnets is linked through the magnetically conductive yoke 104, on one side of the magnets. On the other side of the magnets, opposite the yoke 104, the magnetic flux is not contained in a magnetically conductive material; hence, it permeates substantially unimpeded through the target which is substantially non-magnetic. Thus, two arc-shaped magnetic fields are provided at and above the working surface of the target. This field retains the electrons and causes them to drift in a direction perpendicular to the magnetic field lines, which is parallel to the rows 102 of magnets. This is known as the ExB drift and is described in any basic plasma physics text book. In an ordinary arrangement, this drift path is also parallel to the major axis of the target.

Additionally, the outer rows 108 are slightly longer that the inner row 106 and additional magnets 110 (shown in FIG. 1B), of the same polarity as the outer rows 108, are placed at the ends of the assembly between the two outer rows 108 creating the so-called "turn-around" areas of the drift path. This has the effect of connecting the two drift paths, hence forming one continuous ovular "racetrack" drift path. This optimizes the retention of the electrons and therefore optimizes the efficiency of the sputtering process.

The intuitive route to increasing the field strength is simply to increase the size or the strength of the magnets. Increasing the magnetic strength is limited by availability of stronger magnets. Very high strength magnets are also very expensive, and difficult to work with. Furthermore, stronger magnets could also be applied to any superior design for added benefit such as those of the embodiments of the present invention.

Problems arise when considering magnets of larger cross-section. Increasing the dimension in the radial direction doesn't give a proportional increase in flux at the target surface. As such, this is a self-limiting approach. Increasing the dimension in the direction tangent to the target surface is also self limiting in that the geometry requires moving the bulk of the magnetic material further from the target surface, which serves to weaken the field at the target surface. This is contrary to achieving the desired effect. (see FIG. 2 for one example of such a design)

Another detrimental effect to the approach of increasing the magnet size is that the racetrack is widened. That is to say, the two long portions of the racetrack are separated further from each other. This broadens the turn-around portions of the racetrack leading to an increased relative erosion rate at the ends of the targets. Consequently, these portions of the target are spent before using the greater bulk of the target material. Hence, the target must be taken out of service before fully using the target material.

To understand the increased erosion rate at the ends, one can consider two points on the rotating target surface. One point rotates through the two legs (long portions) of the racetrack. The other point rotates through the turn-around. It will be seen that the point going through the turn-around spends much more time in the racetrack, hence is more heavily eroded. Further discussion of this topic can be found in U.S. Pat. No. 5,364,518 (which is hereby incorporated by reference herein).

The problems described above can be overcome by using four (or more) rows or other independent linear arrays of magnets, instead of the usual 3 rows. This allows the problem of oversized magnets as previously discussed to be overcome. More importantly, though, it allows for a unique modification to the turn-around that minimizes the excessive erosion at the ends of the target without negatively impacting (or at least reducing the negative impact) to the retention of electrons.

DRAWINGS

DETAILED DESCRIPTION

Figure 3A:
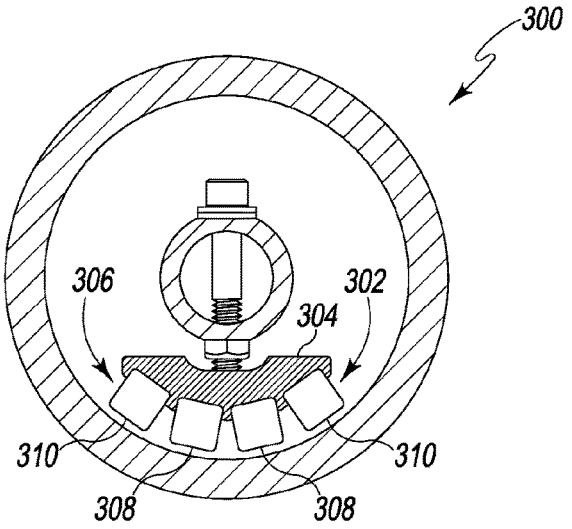
FIG. 3A is a diagram of one exemplary embodiment of a magnetron assembly.

Referring to FIG. 3A, in one exemplary embodiment of the present invention, a magnetron assembly 300 comprises a plurality of magnets 302 and a yoke 304 configured to hold the plurality of magnets 304 in at least four independent linear arrays 306. In the exemplary embodiment shown in FIG. 3A, the magnetron assembly 300 comprises four independent linear arrays 306 of magnets 304 that are arranged in four rows 306.

In this exemplary embodiment, the magnet rows 306 comprise two inner rows 308 of one polarity and two outer rows 310 of the opposite polarity. The rows 306 of magnets 302 are attached to the yoke 304. The yoke 304 is made of magnetically conductive material, such as steel or magnetic stainless steel. This configuration allows additional magnetic mass while allowing the magnets 302 to remain at the closest position relative to the target surface as is feasible. Thus, full advantage is taken of the extra magnetic mass.

Figure 3B:
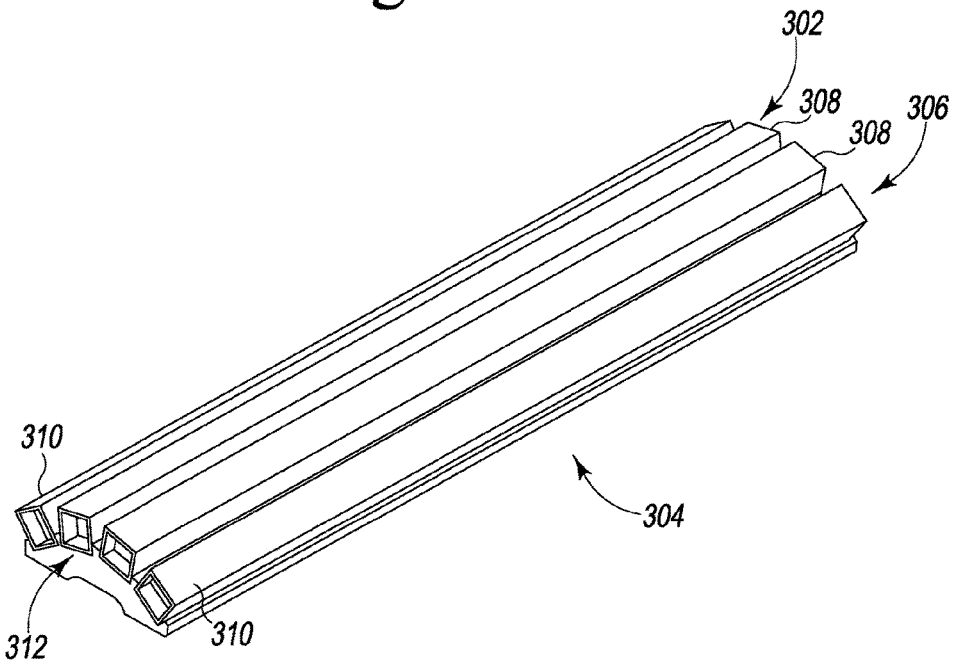
FIG. 3B is a diagram of one exemplary embodiment of a yoke used in the magnetron assembly of FIG. 3A.

As shown in FIG. 3B, in one embodiment, the yoke 304 comprises a plurality of slits or channels 312, one for each of the rows 306 of magnets 302. (It is noted that, for the sake of simplicity, the details regarding the particular magnet arrangement is not shown in FIG. 3B and, instead, are discussed in more detail below in connection with FIGS. 4-6.) The channels 312 are sized so that a portion of the corresponding magnets 302 can be inserted into the channels 312 in order to form the rows 306 of magnets 302 described and shown here. The magnets 302 can be held in place in several ways including, without limitation, using magnet force, friction fit, or adhesives. The use of such channels 312 to form the magnet patterns described here enables the overall magnetron assembly 300 to be reconfigurable.

In the preferred embodiment, the inner rows and outer rows 308 and 310 of magnets 302 have the same strength and the same cross-sectional dimensions such that the assembly is a "balanced magnetron". However, one may optionally place dissimilar magnets in the inner and outer rows 308 and 310 to make "unbalanced" magnetrons.

Figure 4:
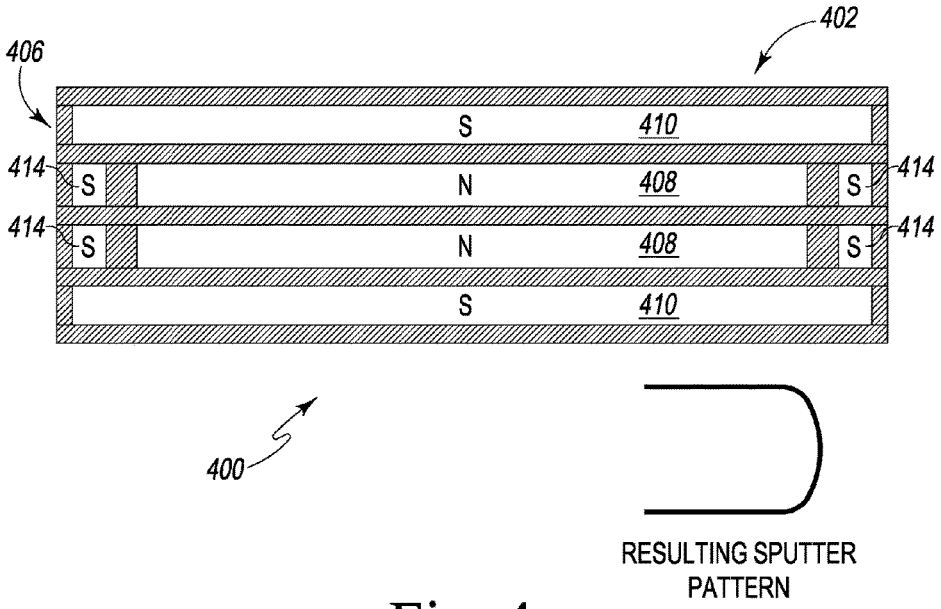
FIG. 4 illustrates one exemplary magnet arrangement suitable for use in the magnetron assembly of FIG. 3A.

FIG. 4 illustrates one exemplary magnet arrangement 400 suitable for use in the magnetron assembly 300 of FIG. 3A. In this exemplary magnet arrangement 400, as with the standard three-row design, the outer rows 410 are longer than inner rows 408 thus providing space for the end magnets 414 used to create the turn-around portions of the racetrack. As depicted, the turn-around-forming magnets 414 are of the same cross section dimensions as that of the magnets of the inner rows 408 and are displaced collinearly with the inner rows 408. The turn-around-forming magnets 414 are, however, of the same polarity as the outer rows 410. This design lends itself to easy modifications of the turn-around areas which will result in more preferred embodiments.

Figure 5:
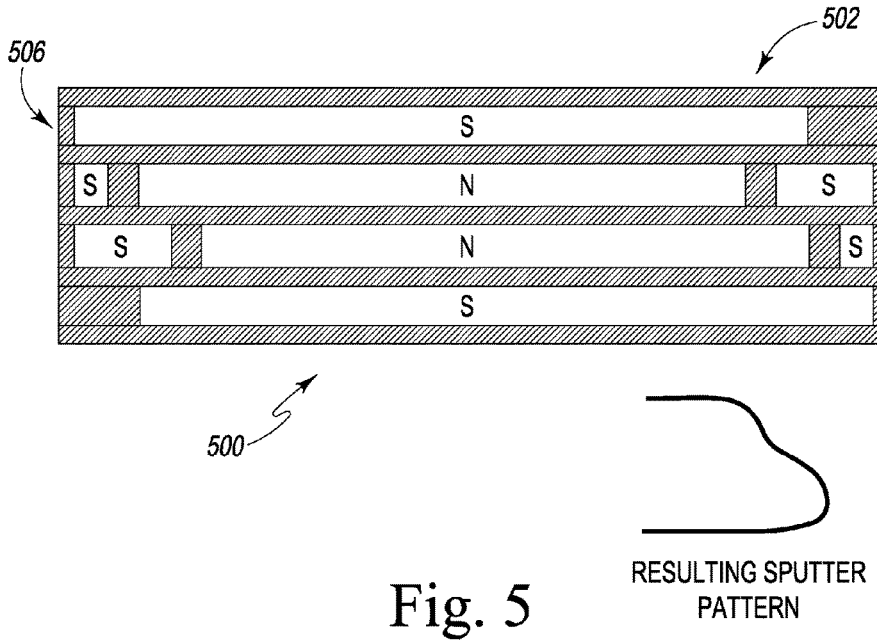
FIG. 5 illustrates another exemplary magnet arrangement suitable for use in the magnetron assembly of FIG. 3A.

FIG. 5 illustrates another exemplary magnet arrangement 500 in which the rows 506 of magnets 502 are laterally offset from each other. This results in a stepped turn-around wherein the actual turn-around is reduced in radius to that of a standard three-row magnetron design. Hence, the target-end erosion rate is not increased beyond that of the standard design, as would be the case of a three-row design with larger magnets. As with the turn-around, the residual step in the drift path, created by this configuration, will produce another area of elevated erosion rate. However, since this area is offset from the turn-around and will not erode any faster than the turn-around area, it will not contribute to premature target burn-through.

Figure 6:
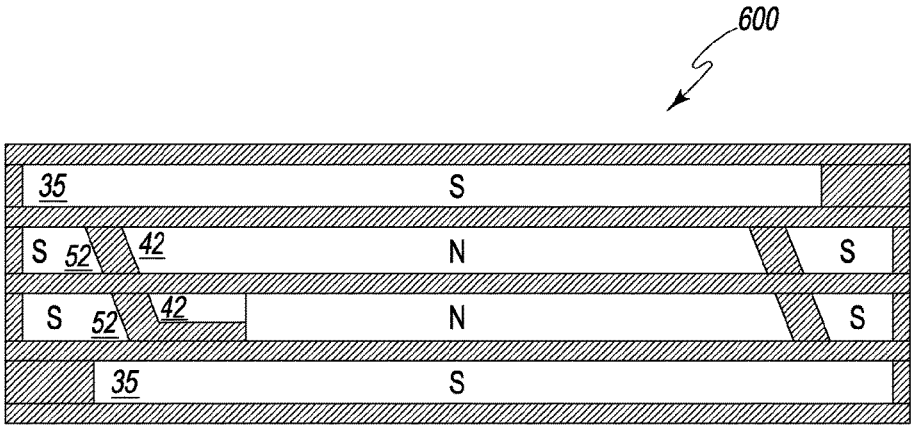
FIG. 6 illustrates yet another exemplary magnet arrangement 600 suitable for use in the magnetron assembly of FIG. 3A.

Although FIG. 5 shows one preferred exemplary arrangement, it should be clear that the design lends itself to any number of permeations that may be useful in other circumstances. For example, magnets having differing magnet strengths, shapes, geometries, sizes and differing gap spacing between the rows can also be implemented. One such exemplary magnet arrangement 600 is shown in FIG. 6, though it is to be understood that other arrangements are possible.

Figure 7:
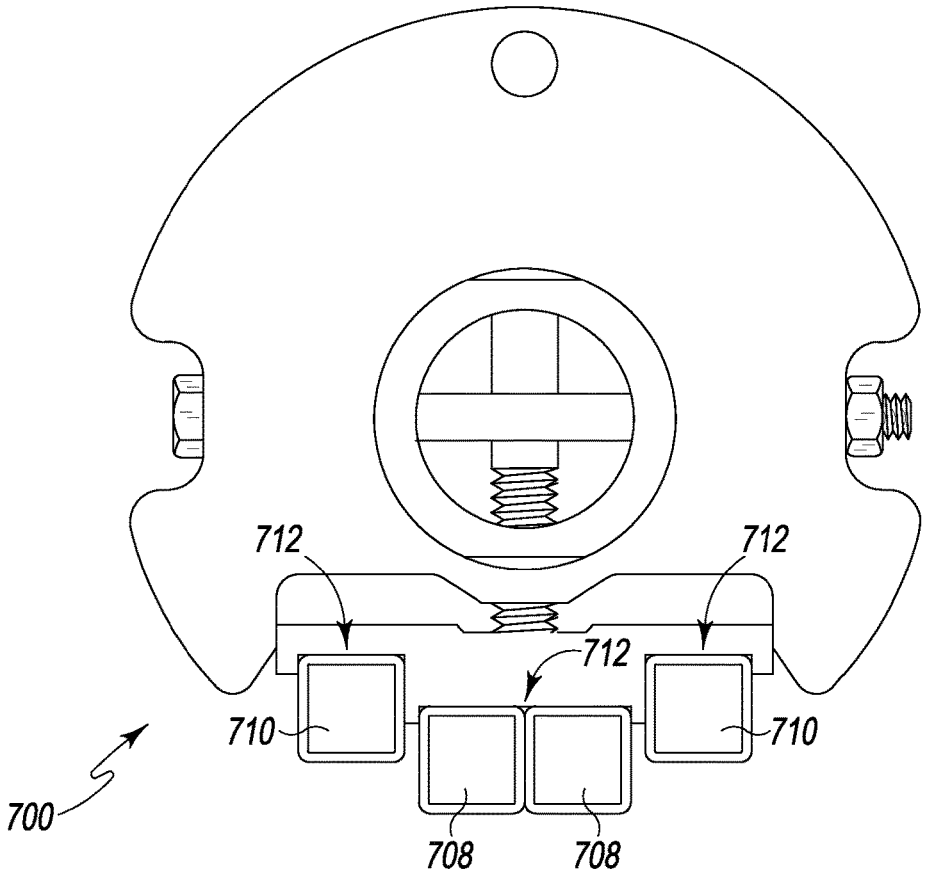
FIG. 7 is a diagram of another exemplary embodiment of a magnetron assembly.

Moreover, in the embodiments shown in FIGS. 3A, 3B, and 4-6, each row of magnets is inserted into a different, respective channel that is formed in the yoke. However, in other embodiments, more than one row (or other independent linear array) of magnets can be housed within a single channel. One example of such an embodiment is shown in FIG. 7. In the example shown in FIG. 7, both of two inner rows 708 of magnets 702 are housed within a common, single channel 712, while each of two outer rows 710 of magnets 702 are housed within separate, respective channels 712.

Although embodiments of the present invention are intended to improve target economics by allowing thicker target material, it can be beneficial to targets of more ordinary material thickness. Because the magnetic field strength is increased, the ionization potential of the electrons is increased by decreasing the electrons radii of gyration and allowing larger electron density in the plasma, which improves electron retention. This results in lower target voltage, which is advantageous when depositing some materials such as TCO. It is well known in the art that lower target voltage in TCO sputter deposition processes results in improved performance of the deposited film.

Another four-row magnetron design is disclosed in U.S. Pat. No. 5,364,518. However, the intent with the design in the '518 patent is to allow easier manipulation of the turn-around in another style. In the '518 patent, the intent was to modify the turn-around by widening the magnetic field relative to the major legs of the racetrack by increasing the distance between magnets. It is not clear if the invention disclosed in U.S. Pat. No. 5,364,518 is feasible, or if it has ever been assembled and tested in the real world. In U.S. Pat. No. 6,375,814 (which is hereby incorporated by reference herein) it is suggested that the invention of the '518 patent will lead to instability in the sputtering process.

U.S. Pat. No. 6,375,814 also refers to a four-row design. However, as depicted, the two inner rows replace a single center row only as a convenience which helps separate the two major legs of the racetrack for the purpose of forming an elliptical shaped turn-around or for manipulating sputtering direction. In practical terms, the '814 patent design can use a single row of magnets for a majority of the length of the assembly.

Embodiments of the present invention have the further advantage over the '814 patent in that it can be completely assembled from different lengths of magnets with the same simple rectangular geometry and a very simple yolk design. Whereas the elliptical assembly of the '814 patent requires a complicated yolk and, in the preferred embodiment, specially designed and manufactured magnets. Furthermore, once assembled, the design of at least some embodiments of the present invention can be easily modified, but the design of the '814 patent is fixed and cannot be modified without complete remanufacturing.

U.S. Pat. No. 6,264,803 (which is hereby incorporated by reference herein) discloses a magnetron with five parallel rows of magnets that form two complete, parallel racetracks. It does not have the benefit of the stronger magnetic field of embodiments of the present invention. However, the '803 patent invention offsets the two racetracks to achieve a similar advantage of the stepped turn-around as with embodiments of the present invention.

The single, continuous race-track of embodiments of the present invention has important advantages over the dual racetrack design of the '803 patent. In the dual racetrack design the space between the outer-most legs are spaced farther apart from each other around, the circumference of the target, as compared to a single racetrack design. This changes the relative angle between the effluxes of sputtered material to plane of the substrate. This increases the average angle of incidence of material being deposited on the substrate. This affects the structure of the deposited film, such as by reducing molecular density, often to an unacceptable degree. In the case of TCO films, density is of great importance.

Another unfortunate result of the design in the '803 patent is that a substantially larger portion of the sputtered material is deposited on the walls of the process chamber and, hence, less of the material is used in making the desired film. This can be reduced or eliminated with some embodiments of the present invention.

Whereas the angle between outer legs of the racetrack of the '803 patent design is about three times that of a standard three row design, the angle between the legs of the design of some embodiments of the present invention is less than twice that of the standard design.

Figure 1A:
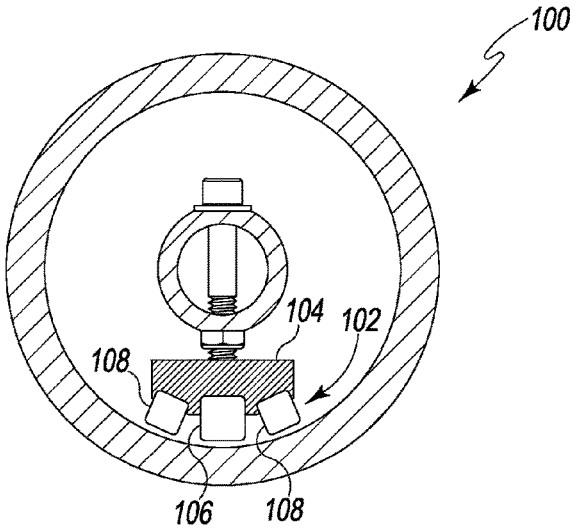
FIG. 1A is a diagram of a typical magnetron assembly for rotating cathodes.
Figure 1B:
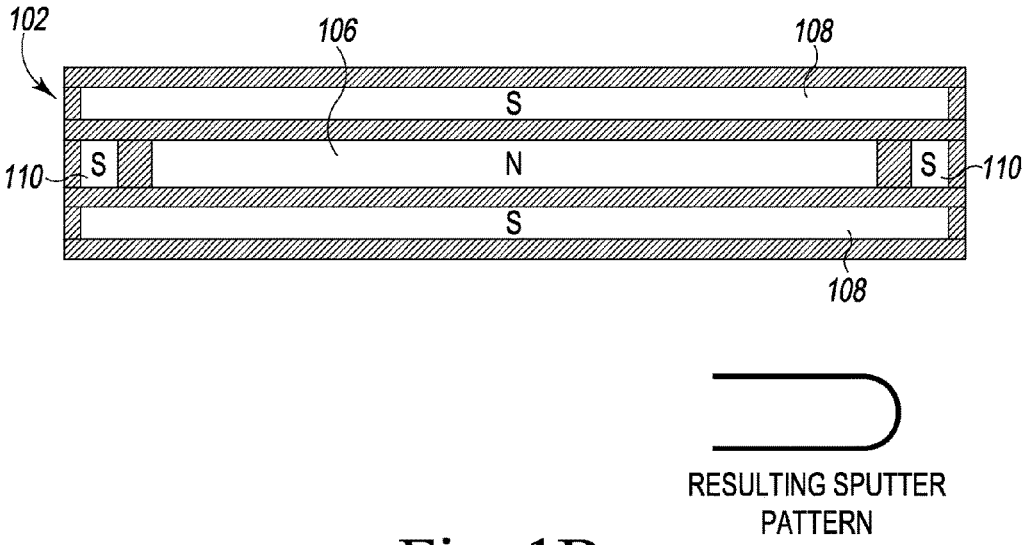
FIG. 1B illustrates the direction of magnetization of the magnets in the magnetron assembly of FIG. 2A.
Figure 2:
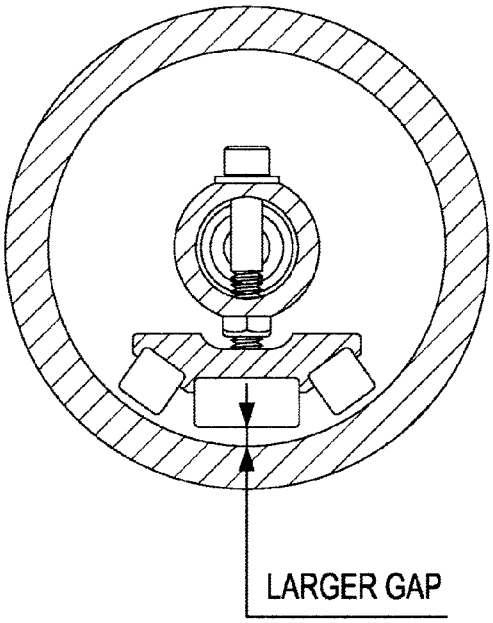
FIG. 2 is a diagram of an alternative design of a magnetron assembly for rotating cathodes.
Figure 8:
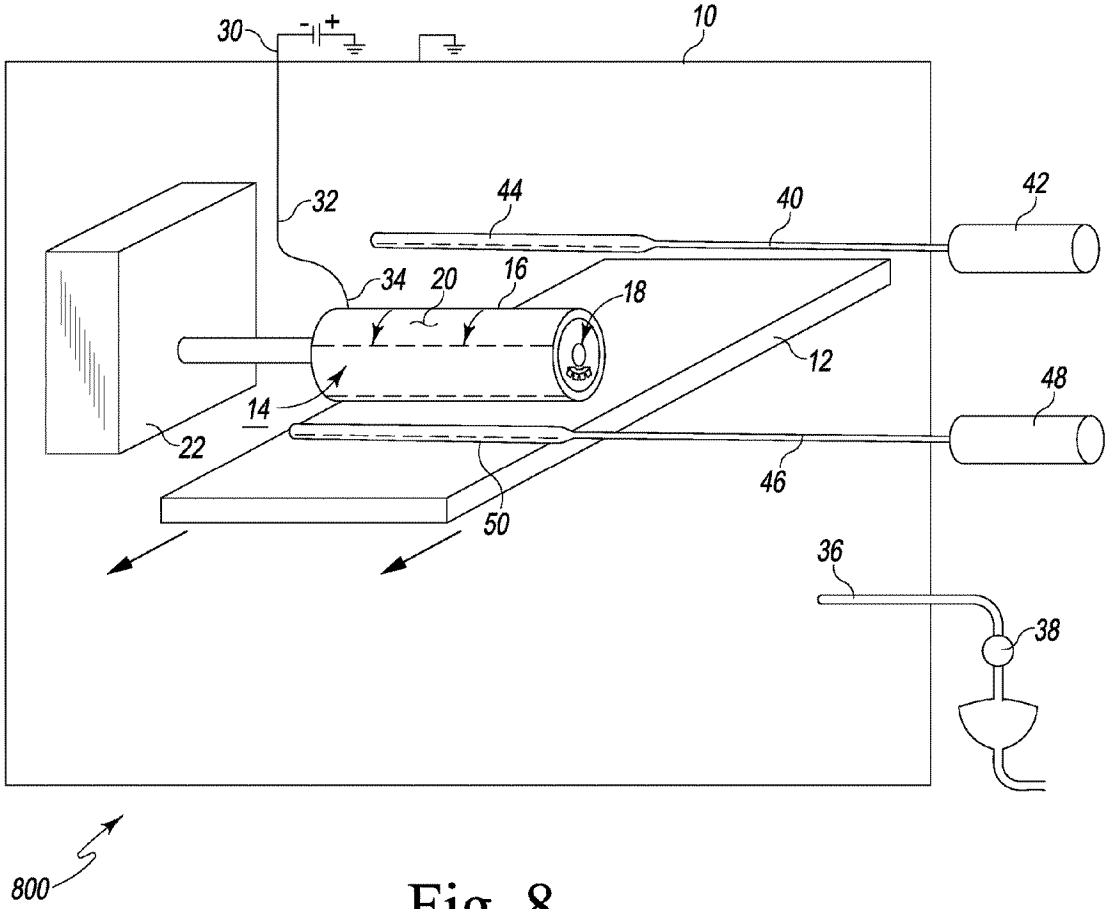
FIG. 8 is a diagram of one exemplary embodiment of a sputtering system in which the magnetron assemblies of FIG. 3A and FIG. 7 can be used.

FIG. 8 illustrates one exemplary embodiment of a sputtering system 800 in which the magnetron assemblies 300 and 700 described above can be used. The exemplary embodiment of a sputtering system 800 shown in FIG. 8 is substantially similar to the sputtering system shown in FIG. 1. of U.S. Pat. No. 5,096,562 (which is hereby incorporated herein by reference) and described in column 2, line 55—column 4, line 23 of the '562 patent, with the main difference being the use of a magnetron assembly 18 of the type described above in which at least four rows (other independent linear arrays) of magnets are attached to or otherwise held in a yoke.

A plasma is formed within an enclosed reaction chamber 10, in which a vacuum is maintained, for the purpose of depositing a thin film of material on a substrate 12 as it moves through the chamber 10. The substrate 12 can be most anything that will accept the film to be deposited on it, and is usually some vacuum compatible material, such as metal, glass, and some plastics. The film can also be deposited over other films or coatings that have previously been formed on a substrate surface.

A cathode assembly 14 comprises generally an elongated rotatable cylindrical tube 16, mounted in the reaction chamber 10, and having a target surface 20. A magnetron assembly 18 of the type described above is carried within a lower portion of the tube 16 and does not rotate with it. The inside of the tube 16 is typically water cooled, as described later, in order to allow the system to operate at high electrical power levels. The tube 16 is supported in a horizontal position and is rotated by a drive system 22 at a constant speed about its longitudinal axis.

The tube 16 may be constructed in one of many different forms, depending upon the nature and composition of the target material to be exposed on the outside cylindrical surface 20. One structure has walls made substantially entirely of solid target material. Another structure is formed of a core of suitable nonmagnetic material such as, for example, brass or stainless steel, and is of a diameter, wall thickness and length required for a particular operation to be performed. Applied to the outer surface of the core is a layer of a selected target material 20 to be deposited onto the substrate 12 being coated. In either case, the tube 16 and layer of target material 20 constitute a tubular target or sputtering source in place of a more conventional planar target.

A cathode potential sufficient to cause sputtering to occur is supplied to the rotating cathode 14 from a power source 30 through a power line 32 having sliding contact 34 with the tube 16 by a conventional electrical brush. The power source 30 is of a direct current type in the example being described but alternating current power sources can also be used in such structures. The enclosure of the reaction chamber 10 is conductive and electrically grounded. It serves as an anode in the sputtering process. A separate anode may be optionally employed and maintained at a small positive voltage.

In order to obtain the low pressure necessary for the coating operation to be performed, the reaction chamber 10 is provided with an outlet tube 36 communicating with a vacuum pump 38.

In order to provide the chamber 10 with the gases necessary for the coating operation, a gas supply system is included. A first gas supply tube 40 extends into the coating chamber 10 from a source 42 of an inert gas. Nozzles 44 connected to inlet tube 40 distribute the inert gas in a region above the rotating cathode 14. It is the inert gas that breaks down into electrically charged ions under the influence of an electric field established between the target surface 20 and the grounded chamber enclosure 10. The positive ions are attracted to and bombard the target surface 20 in an area to which they are confined by the magnetic field, primarily in two parallel strips, one between each of the opposing magnetic poles, along the length of the cylinder 16 at its bottom, opposite the magnet assembly 18.

A second gas supply tube 46 extends into the chamber 10 from a reactive gas source 48. Nozzles 50 connected to inlet tube 46 distribute the reactant gas in a region close to and across the width of the substrate 12 being coated. Molecules of the reactive gas combine with molecules sputtered from the target surface, as a result of ion bombardment, to form the desired molecules that are deposited on the top surface of the substrate 12.

Many variations in the gas supply system shown are practical as well. The inert and reactive gases from the sources 42 and 48 can be combined and delivered into the chamber 10 through a common tube and set of nozzles. When this is done, the delivery tube is preferably positioned along a side of the rotating target tube 16 and parallel with its longitudinal axis. Two such tubes can be used, one on each side of the target tube 16 and parallel with its longitudinal axis, each delivering the same combination of inert and reactive gases. Also, more than one reactive gas can be simultaneously supplied, depending upon the film being deposited.

A number of embodiments have been described. Nevertheless, it will be understood that various modifications to the described embodiments may be made without departing from the spirit and scope of the claimed invention.

What is claimed is:

1. A magnetron assembly comprising:

a plurality of magnets; and a yoke configured to hold all of the plurality of magnets within four straight, parallel, and independent linear arrays, the linear arrays comprising two outer linear arrays and two inner linear arrays;

wherein the plurality of magnets is arranged in the yoke so as to form a pattern comprising an outer portion and an inner portion, wherein the outer portion substantially surrounds the perimeter of the inner portion;

wherein the magnets used to form the outer portion are oriented to utilize a first polarity and the magnets used to form the inner portion are oriented to utilize a second polarity;

wherein the outer portion of the pattern comprises:

the outer linear arrays of the first polarity; and magnets at the ends of the inner linear arrays, the magnets at the ends of the inner linear arrays having the first polarity and the magnets that make up the majority of the inner linear arrays having the second polarity; and wherein magnets of the two inner linear arrays having the second polarity are laterally offset from each other so as to form a magnetic step.

2. The magnetron assembly of claim 1, wherein magnets at the ends of the two inner linear arrays having the first polarity are laterally offset from each other so as to maintain the magnetic step.

3. The magnetron assembly of claim 1, wherein magnets of the two inner linear arrays having the second polarity are laterally offset from each other so as to form a respective magnetic step at each end of the pattern.

4. The magnetron assembly of claim 1, wherein at least one of the plurality of magnets has a geometry, size, or magnetic strength that differs from at least one of the other magnets.

5. The magnetron assembly of claim 1, wherein at least one of the plurality of magnets has a tapered shape that alters a direction of an associated plasma drift pattern, wherein the direction of the taper is evident in a radial projection of the assembly and is not evident in a cross-sectional view of the assembly.

6. The magnetron assembly of claim 1, wherein at least some of the magnets from the two inner linear arrays that are laterally offset from each other have lengths that differ from one another in order to form the magnetic step.

7. The magnetron assembly of claim 1, wherein the yoke is configured so that the pattern formed by the plurality of magnets can be re-configured without modifying the yoke and by doing at least one of: changing the polarity of at least some of the magnets held by the yoke and changing the length of at least some of the magnets held by the yoke.

8. The magnetron assembly of claim 1, wherein at least some of the magnets are at least partially held in place within the yoke using magnetic force.

9. The magnetron assembly of claim 1, wherein the yoke comprises at least one channel into which at least one of the plurality of magnets is inserted.

10. The magnetron assembly of claim 9, wherein the yoke comprises at least four channels, wherein each of the independent linear arrays is held in the yoke within a respective one of the channels.

11. The magnetron assembly of claim 9, wherein at least two of the independent linear arrays are held in the yoke within a single channel.

12. A sputtering system comprising:

a chamber through which a substrate moves;

a cathode assembly comprising:

an elongated rotatable cylindrical tube mounted in the chamber and having a target surface;

a magnetron assembly positioned within the elongated rotatable cylindrical tube, the magnetron assembly comprising:

a plurality of magnets; and a yoke configured to hold all of the plurality of magnets within four straight, parallel, and independent linear arrays, the linear arrays comprising two outer linear arrays and two inner linear arrays;

wherein the plurality of magnets is arranged in the yoke so as to form a pattern comprising an outer portion and an inner portion, wherein the outer portion substantially surrounds the perimeter of the inner portion;

wherein the magnets used to form the outer portion are oriented to utilize a first polarity and the magnets used to form the inner portion are oriented to utilize a second polarity;

wherein the outer portion of the pattern comprises:

the outer linear arrays of the first polarity; and magnets at the ends of the inner linear arrays, the magnets at the ends of the inner linear arrays having the first polarity and the magnets that make up the majority of the inner linear arrays having the second polarity; and wherein magnets of the two inner linear arrays having the second polarity are laterally offset from each other so as to form a magnetic step.

13. The system of claim 12, further comprising a drive system to support and rotate the elongated rotatable cylindrical tube.

14. The system of claim 12, wherein the system is configured to form a plasma within the chamber in connection with depositing a film on the substrate as it moves through the chamber.

15. The system of claim 12, wherein magnets at the ends of the two inner linear arrays having the first polarity are laterally offset from each other so as to maintain the magnetic step.

16. The system of claim 12, wherein magnets of the two inner linear arrays having the second polarity are laterally offset from each other so as to form a respective magnetic step at each end of the pattern.

17. The system of claim 12, wherein at least one of the plurality of magnets has a geometry, size, or magnetic strength that differs from at least one of the other magnets.

18. The system of claim 12, wherein at least one of the plurality of magnets has a tapered shape.

19. The system of claim 12, wherein each of the magnets comprises a square cross section.

20. The system of claim 12, wherein at least some of the magnets from the two inner linear arrays that are laterally offset from each other have lengths that differ from one another in order to form the magnetic step.

21. The system of claim 12, wherein the yoke is configured so that the pattern formed by the plurality of magnets can be re-configured without modifying the yoke and by doing at least one of: changing the polarity of at least some of the magnets held by the yoke and changing the length of at least some of the magnets held by the yoke.

22. The system of claim 12, wherein at least some of the magnets are at least partially held in place within the yoke using magnetic force.

23. The system of claim 12, wherein the yoke comprises at least one channel into which at least one of the plurality of magnets is inserted.

24. The system of claim 23, wherein the yoke comprises at least four channels, wherein each of the independent linear arrays is held in the yoke within a respective one of the channels.

25. The system of claim 23, wherein at least two of the independent linear arrays are held in the yoke within a single channel.

*26. A magnetron assembly comprising:*

*a plurality of magnets; and*

*a yoke configured to hold the plurality of magnets;*

*wherein the plurality of magnets is arranged to form a pattern comprising an outer portion and an inner portion, wherein the outer portion substantially surrounds a perimeter of the inner portion;*

*wherein the magnets of the inner portion are oriented to utilize a first polarity and the magnets of the outer portion are each oriented to utilize a respective polarity other than the first polarity;*

*wherein the pattern comprises a respective turnaround portion at each end of the pattern;*

*wherein the magnets of at least one turnaround portion are in at least four straight, parallel, and independent linear arrays, the linear arrays comprising at least two inner linear arrays that include some of the magnets of the inner portion of the pattern and some of the magnets of the outer portion of the pattern; and*

*wherein some of the magnets in the inner linear arrays are oriented to have laterally offset polarities so as to form a magnetic step in the at least one turnaround portion.*

*27. The magnetron assembly of claim 26, wherein magnets at the ends of the two inner linear arrays are laterally offset from each other so as to maintain the magnetic step.*

*28. The magnetron assembly of claim 26, wherein magnets of the two inner linear arrays are laterally offset from each other so as to form a respective magnetic step at each end of the pattern.*

*29. The magnetron assembly of claim 26, wherein at least one of the plurality of magnets has a geometry, size, or magnetic strength that differs from at least one of the other magnets.*

*30. The magnetron assembly of claim 26, wherein at least one of the plurality of magnets has a tapered shape that alters a direction of an associated plasma drift pattern, wherein the direction of the taper is evident in a radial projection of the assembly and is not evident in a cross-sectional view of the assembly.*

*31. The magnetron assembly of claim 26, wherein at least some of the magnets from the inner linear arrays have lengths that differ from one another in order to form the magnetic step.*

*32. The magnetron assembly of claim 26, wherein the yoke is configured so that the pattern formed by the plurality of magnets can be re-configured without modifying the yoke and by doing at least one of: changing the polarity of at least some of the magnets held by the yoke, and changing the length of at least some of the magnets held by the yoke.*

*33. The magnetron assembly of claim 26, wherein at least some of the magnets are at least partially held in place within the yoke using magnetic force.*

*34. The magnetron assembly of claim 26, wherein the yoke comprises at least one channel into which at least one of the plurality of magnets is inserted.*

*35. The magnetron assembly of claim 26, wherein the yoke comprises at least four channels, wherein each of the independent linear arrays is held in the yoke within a respective one of the channels.*

*36. The magnetron assembly of claim 26, wherein at least two of the independent linear arrays are held in the yoke within a single channel.*

*37. A sputtering system comprising:*

*a chamber through which a substrate moves; and*

*a cathode assembly comprising:*

*an elongated rotatable cylindrical tube mounted in the chamber and having a target surface;*

*a magnetron assembly positioned within the elongated rotatable cylindrical tube, the magnetron assembly comprising:*

*a plurality of magnets; and*

*a yoke configured to hold the plurality of magnets;*

*wherein the plurality of magnets is arranged to form a pattern comprising an outer portion and an inner portion, wherein the outer portion substantially surrounds a perimeter of the inner portion;*

*wherein the magnets of the inner portion are oriented to utilize a first polarity and the magnets of the outer portion are each oriented to utilize a respective polarity other than the first polarity;*

*wherein the pattern comprises a respective turnaround portion at each end of the pattern;*

*wherein the magnets of at least one turnaround portion are in at least four straight, parallel, and independent linear arrays, the linear arrays comprising at least two inner linear arrays that include some of the magnets of the inner portion of the pattern and some of the magnets of the outer portion of the pattern; and*

*wherein some of the magnets in the inner linear arrays are oriented to have laterally offset polarities so as to form a magnetic step in the at least one turn-around portion.*

*38. The system of claim 37, further comprising a drive system to support and rotate the elongated rotatable cylindrical tube.*

*39. The system of claim 37, wherein the system is configured to form a plasma within the chamber in connection with depositing a film on the substrate as it moves through the chamber.*

*40. The system of claim 37, wherein magnets at the ends of the two inner linear arrays are laterally offset from each other so as to maintain the magnetic step.*

*41. The system of claim 37, wherein magnets of the two inner linear arrays are laterally offset from each other so as to form a respective magnetic step at each end of the pattern.*

*42. The system of claim 37, wherein at least one of the plurality of magnets has a geometry, size, or magnetic strength that differs from at least one of the other magnets.*

*43. The system of claim 37, wherein at least one of the plurality of magnets has a tapered shape.*

*44. The system of claim 37, wherein each of the magnets comprises a square cross section.*

*45. The system of claim 37, wherein at least some of the magnets from the two inner linear arrays have lengths that differ from one another in order to form the magnetic step.*

* * * * *